United States Patent [19]

Davey et al.

[11] 4,226,649
[45] Oct. 7, 1980

[54] METHOD FOR EPITAXIAL GROWTH OF GAAS FILMS AND DEVICES CONFIGURATION INDEPENDENT OF GAAS SUBSTRATE UTILIZING MOLECULAR BEAM EPITAXY AND SUBSTRATE REMOVAL TECHNIQUES

[75] Inventors: John E. Davey, Alexandria; Aristos Christou, Springfield, both of Va.

[73] Assignee: The United States of America as represented by the Secretary of the Navy, Washington, D.C.

[21] Appl. No.: 74,448

[22] Filed: Sep. 11, 1979

[51] Int. Cl.³ .................. H01L 21/203; H01L 21/441
[52] U.S. Cl. .................. 148/175; 29/571; 29/576 E; 29/580; 29/589; 156/649; 156/656; 156/662; 357/15; 357/16; 357/61; 357/65; 357/67; 357/89
[58] Field of Search .............. 148/175; 29/571, 576 E, 29/580, 589; 156/648, 649, 655, 656, 662; 357/15, 16, 23, 61, 65, 67, 89

[56] References Cited

U.S. PATENT DOCUMENTS

| | | | |
|---|---|---|---|
| 3,368,125 | 2/1968 | Pasierb | 357/16 X |
| 3,699,401 | 10/1972 | Tietjen et al. | 357/16 |
| 3,981,073 | 9/1976 | Dully | 29/580 |
| 4,000,020 | 12/1976 | Gartman | 148/175 |
| 4,021,767 | 5/1977 | Nonaka et al. | 29/588 X |
| 4,118,857 | 10/1978 | Wong | 29/574 |
| 4,186,410 | 1/1980 | Cho et al. | 357/67 |
| 4,188,710 | 2/1980 | Davey et al. | 29/580 |

OTHER PUBLICATIONS

Anderson et al., "Smooth and Continuous Ohmic Contacts . . . Ge Films", J. Applied Phys., vol. 49, No. 5, May 1978, pp. 2998-3000.

Primary Examiner—L. Dewayne Rutledge
Assistant Examiner—W. G. Saba
Attorney, Agent, or Firm—R. S. Sciascia; Philip Schneider; Melvin L. Crane

[57] ABSTRACT

A method of growing high-quality, super-abrupt, thin-film epitaxial layers independent of a GaAs substrate. An elemental semiconductor of germanium is used to initiate growth of an active material, typically doped n-type. A semi-insulating layer or n+ layer is grown on the n-type active material. Subsequent to growth of the semi-insulating layer, a thin cap of germanium is deposited on the composite. Gold is deposited onto the germanium cap to form an eutectic-alloy layer with the germanium. The alloy is formed and the composite is bonded to a metal, glass, or ceramic substrate and the semiconductor (germanium) is removed by etching and the n-layer is finally etched to provide a clean-up and to tailor the layer to a desired thickness. Subsequent steps are employed to form desired structures such as field-effect transistors or Schottky-barrier devices.

18 Claims, 10 Drawing Figures

METHOD FOR EPITAXIAL GROWTH OF GAAS FILMS AND DEVICES CONFIGURATION INDEPENDENT OF GAAS SUBSTRATE UTILIZING MOLECULAR BEAM EPITAXY AND SUBSTRATE REMOVAL TECHNIQUES

BACKGROUND OF THE INVENTION

This invention relates to the growth of GaAs films and more particularly to a method for epitaxial growth of GaAs films and device configurations independent of GaAs substrates.

Heretofore, active epitaxial layers and/or buffer layers of GaAs have been grown using bulk GaAs substrate material as the host material on which the epitaxial growth is initiated. In the prior art growth process, non-stoichiometric interface problems arise at the "growing surface". A prior-art method of forming and removing an electrical element from a deposited substrate is taught by U.S. Pat. No. 4,021,767. This patent does not concern itself with critical lattice matching and thermal matching to obtain high crystalline perfection. It is involved in obtaining thin electrical detectors of a specific thickness in order to make Hall measurements more accurately.

U.S. Pat. No. 4,118,857 is directed to the growth of epitaxial layers which are single crystal, with uniform thickness and electrical properties. The substrate has a different composition or electrical properties from that of the epitaxial layer. Hall measuring devices are made by this process.

SUMMARY OF THE INVENTION

The invention comprises a method of growing high-quality, crystalline, electrical or optical, super-abrupt thin-film epitaxial layers independent of GaAs substrates. A germanium substrate is used upon which the GaAs is deposited. The GaAs composite is doped with n-type dopant to a desired concentration and provided with an Au-Ge eutectic which is attached to a carrier substrate. The germanium substrate is removed to leave the GaAs layer-composite supported by a carrier.

A similar method may be used to structure high performance Shottky barrier mixer or detector diodes.

DETAILED DESCRIPTION

Figure 1:
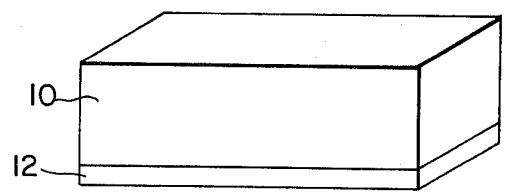
FIG. 1 is a schematic illustration of a thin layer of GaAs on a prepared surface of a germanium substrate.
Figure 2:
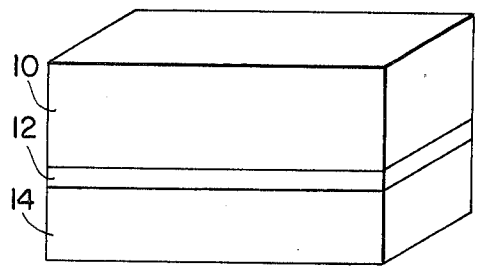
FIG. 2 is a schematic illustration of a semi-insulator layer on the composite element shown in FIG. 1.
Figure 3:
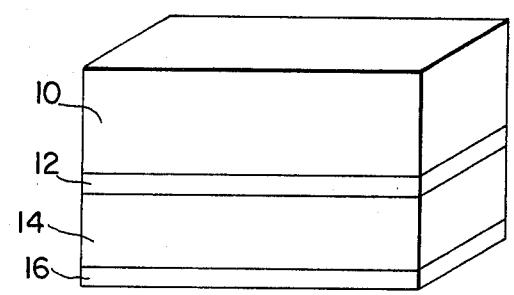
FIG. 3 is a schematic illustration of a Au-Ge alloy layer on the semi-insulator layer of the composite shown in FIG. 2.
Figure 4:
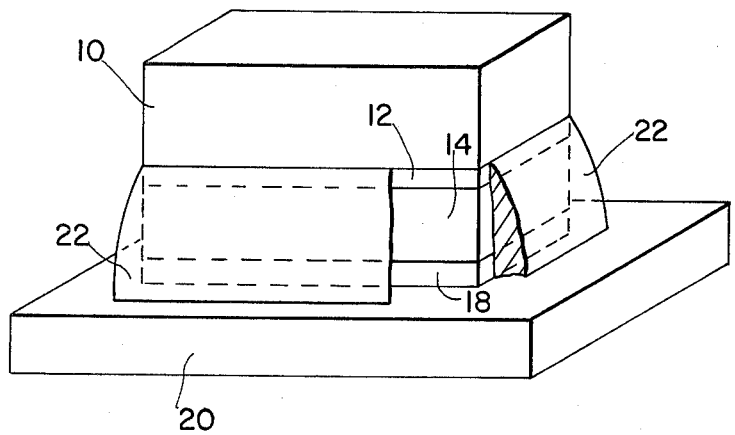
FIG. 4 is a schematic illustration of the composite of FIG. 3 bonded to a carrier substrate.
Figure 5:
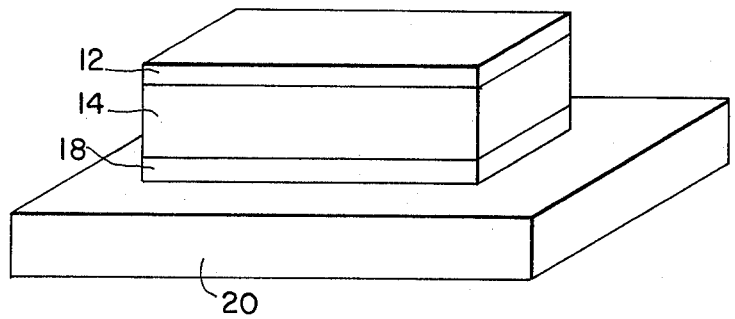
FIG. 5 is a schematic illustration of the composite of FIG. 4 with the germanium substrate shown in FIG. 1 stripped off to expose the GaAs layer.
Figure 6:
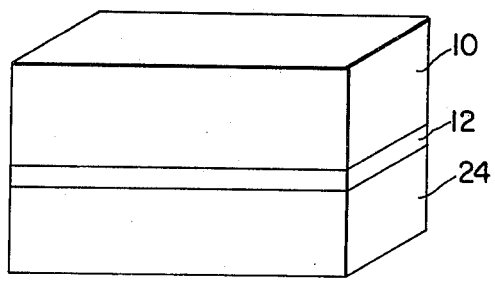
FIG. 6 is a schematic illustration of a composite such as shown in FIG. 1 with a n+ layer added.
Figure 7:
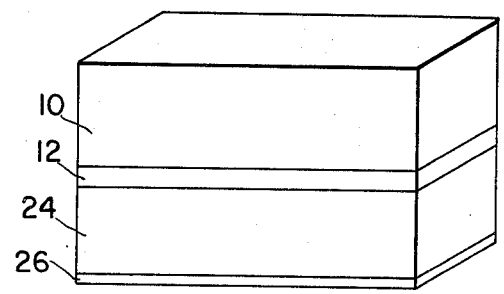
FIG. 7 is a schematic illustration of the composite shown in FIG. 6 with an Au-Ge eutectic mixture evaporated onto the composite of FIG. 6.
Figure 8:
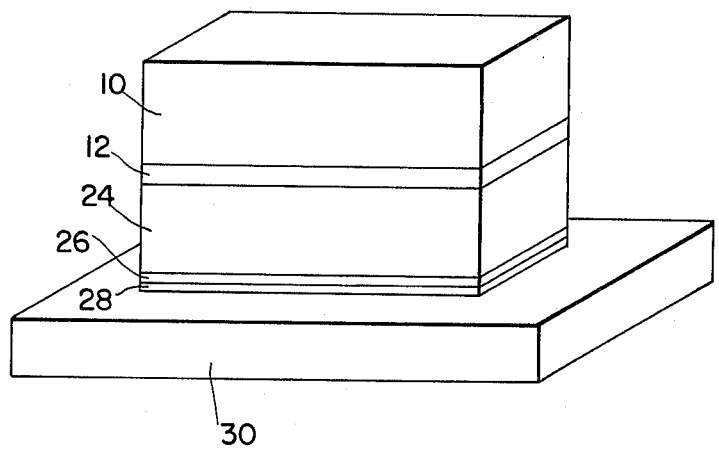
FIG. 8 is a schematic illustration of the composite shown in FIG. 7 bonded to a carrier.
Figure 9:
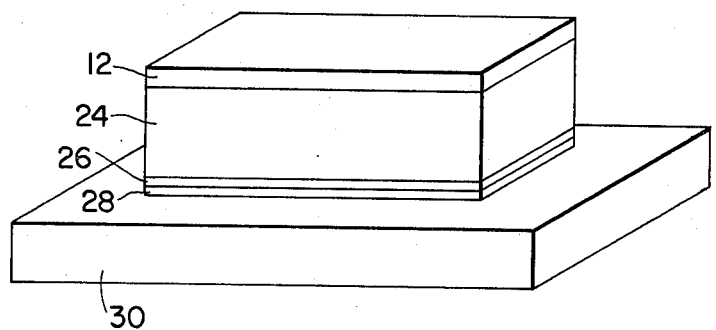
FIG. 9 is a schematic illustration of the composite of FIG. 8 with the germanium substrate removed.
Figure 10:
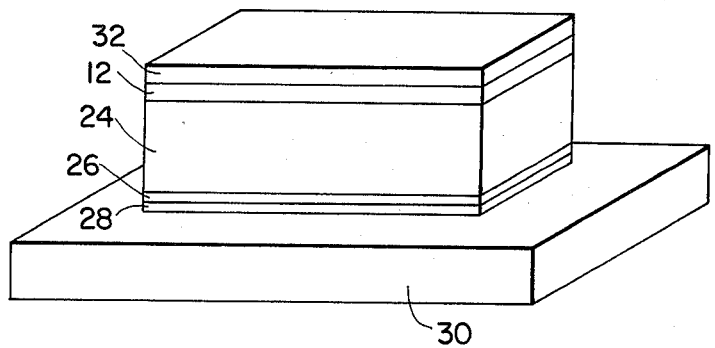
FIG. 10 is a schematic illustration of the composite of FIG. 9 with a Shottky barrier evaporated onto the composite to complete the Shottky barrier device.

A high-resistivity, low-dislocation-count, germanium substrate 10 of an orientation such as 100, 110 or 111 having a thickness of from 3–5 mils is chemically polished to produce a high-quality surface upon which a thin layer of active GaAs material 12 is epitaxially grown. The germanium substrate is placed in a high vacuum system of about $10^{-6}$ to $10^{-10}$ Torr and outgassed by heating to a temperature of about 550° to 600° C. for about 0.25 to 0.5 hours to evaporate surface germanium oxides. The temperature is then lowered to the molecular beam epitaxial (M.B.E.) growth temperature of GaAs from about 500 to about 575° C.; and the thin layer 12 of active material GaAs is grown on the germanium substrate. The thin layer is typically doped n-type with a dopant such as sulfur, germanium or selium to a concentration of about $10^{17}/cm^3$ and to a thickness of from $3-5 \times 10^3$ Å. Once the desired thickness of the GaAs layer has been reached, the n-type doping is abruptly shut-off and a semi-insulating layer 14 is initiated without termination or interruption of the GaAs M.B.E. process.

Subsequent to the growth of the insulating layer to a thickness of about 1 μm, a thin "cap" 16 of germanium about $3-5 \times 10^3$ Å may be deposited on the composite to provide one of the constituents for an Au-Ge alloy contact to "carrier". After the germanium cap has been deposited, the composite is heated to a temperature of about 200°–400° C. in order to deposit a gold layer 18 having a thickness of $3-5 \times 10^3$ Å on the germanium layer. The gold layer forms an eutectic-alloy layer 18 with the germanium. The composite is removed from the vacuum system and the composite is bonded to a metal, glass or ceramic "carrier" substrate 20 with the Au-Ge alloy side bonded to the "carrier" substrate. Once the composite has been bonded to the carrier substrate, the ends and sides of the composite are protected against chemical action of an etchant by use of a wax or other protective coating 22 and the germanium substrate is etched away by use of a known etchant such as 30 ml $H_2O$, 10 ml HF and 30–90 drops $H_2O_2$.

Once the original germanium substrate 10 has been etched away, the GaAs layer is etched to clean-up the GaAs layer and/or to tailor the GaAs layer to the desired thickness. The GaAs layer can be photolithographically processed to form any desired structure well known in the art.

After the germanium cap has been deposited, the composite may be removed from the first vacuum system and transferred to a second vacuum system to deposit the gold layer. This will avoid any possibility of contaminating the gold layer.

The same general procedure may be carried out to form high performance Schottky-barrier mixer and detector diodes. The process is the same as set forth above in growing an epitaxial GaAs layer 12 on a germanium substrate 10, as shown in FIG. 1, in which a GaAs layer is doped with a n-dopant to about $10^{17}/cm^3$ in a vacuum. Instead of abruptly shutting-off the n-dopant such as sulfur, germanium or selenium at a thickness of about $3-5 \times 10^3$ Å, the concentration of the n-dopant is abruptly changed to produce an n+ layer 24 having a concentration of $10^{18}/cm^3$ with a thickness of about $3-5 \times 10^3$ Å. The n+ layer has a super-abrupt interface with the n-layer 12. A thin Au-Ge eutectic mixture may now be evaporated onto the n+ layer to form layer 26 and the composite directly bonded or soldered to a copper carrier 30. The original germanium substrate 10 is removed and the GaAs layer is cleaned-up and tailored to the desired thickness as set forth above and a Shottky barrier 32 is evaporated onto the GaAs layer 12.

Schottky barrier devices made in accordance with the method set forth herein allow for a large reduction of the series resistance of Schottky diodes with a substantial improvement in high frequency performance and reliability.

The same principles may be applied to the growth of p-n junction, n-p-n, or p-n-p structures. The method may also include polygallium arsenside as a semi-insulating layer subsequent to the growth of the active layers.

Growing super-abrupt thin-film epitaxial layers independent of GaAs substrate utilizes an elemental semiconductor (germanium) to initiate the growth process. The use of an elemental semiconductor obviates the problem of a non-stoichiometric interface at the "growing surface". The active interface is grown in situ by the method of this invention whereas in other processes, the active interface is at the substrate layer interface at which growth proceeds; that is, the non-ideal non-stoichiometric interface. The semi-insulating layer or n+ layer may be grown to a thickness required in conjunction with the M.B.E. process. Also, high quality GaAs substrates and buffer layers will no longer be required to initiate epitaxial growth, a single achievement.

Obviously many modifications and variations of the present invention are possible in light of the above teachings. It is therefore to be understood that within the scope of the appended claims the invention may be practiced otherwise than as specifically described.

What is claimed and desired to be secured by Letters Patent of the United States is:

1. A method of growing high-quality super-abrupt thin-film epitaxial layers to form a composite comprising:
   polishing one surface of a high-resistivity, low-dislocation-count, germanium substrate,
   placing said polished germanium substrate into a vacuum deposition system,
   evacuating said system to a high vacuum,
   outgassing said substrate by heating said evacuated system to a temperature greater than a molecular beam epitaxial growth temperature,
   lowering the temperature of the system to the molecular beam epitaxial growth temperature for GaAs,
   growing a thin layer of n-doped GaAs onto said polished surface of said germanium substrate from a n-type doping source,
   abruptly shutting off said n-type doping source,
   simultaneous with shutting off said n-type doping source, initiating the growth of a semi-insulating layer without interrupting the GaAs growth process to obtain a layer of desired thickness,
   growing a thin layer of germanium onto said semi-insulating layer,
   reheating said doped substrate sufficiently to deposit a layer of gold onto said thin germanium layer to form a gold-germanium alloy,
   removing the layered substrate from said vacuum system and bonding the gold-germanium layer to a carrier substrate,
   applying a protective coating to the ends and edges of said composite up to said germanium substrate,
   etching said germanium substrate from the layered substrate, and
   etching said GaAs layer to tailor said GaAs layer to a desired thickness,
   whereby said GaAs layer may be photolithographically processed to form desired structures such as GaAs field-effect-transistors.

2. A method as claimed claim 1 wherein:
   said high temperature vacuum system is heated to a temperature of from about 550°–600° C. to outgass said germanium substrate.

3. A method as claimed in claim 1 wherein:
   the concentration of said n-type doped layer is about $10^{17}/cm^3$, and
   the thickness of said n-type doped layer is $3-5 \times 10^3 Å$.

4. A method as claimed in claim 2 wherein:
   the concentration of said n-type doped layer is about $10^{17}/cm^3$, and
   the thickness of said n-type doped layer is $3-5 \times 10^3 Å$.

5. A method as claimed in claim 3 wherein:
   the temperature of said second vacuum system is from about 500° to about 575° C.

6. A method as claimed in claim 4 wherein:
   the temperature for reheating said doped substrate is from about 500° to about 575° C.

7. A method as claimed in claim 5 wherein:
   the thickness of said semi-insulating layer is from 1–5 μm.

8. A method as claimed in claim 6 wherein:
   the thickness of said semi-insulating layer is from 1–5 μm.

9. A method as claimed in claim 7 wherein:
   said thin layer of germanium has a thickness of from about $3-5 \times 10^3 Å$.

10. A method as claimed in claim 8 wherein:
    said thin layer of germanium has a thickness of from about $3-5 \times 10^3 Å$.

11. A method of growing high-quality thin-film epitaxial layers comprising:
    polishing one surface of a high-resistivity, low-dislocation-count germanium substrate by chemically polishing said one surface,
    placing said germanium substrate in a vacuum system,
    evacuating said vacuum system to a high vacuum pressure,
    heating said vacuum system to a temperature greater than the molecular beam epitaxial growth temperature for GaAs, to outgas said germanium substrate,
    lowering the temperature of said vacuum system to the molecular beam epitaxial growth temperature for GaAs,
    growing a thin layer of n-doped GaAs onto said prepared surface of said germanium from a n-type doping source,
    abruptly changing the concentration of n-dopant to produce a n+ layer with a super abrupt interface to the n-layer to form a composite,
    growing a thin layer of germanium on the n+ doped layer of germanium,
    reheating said vacuum system sufficiently to deposit a layer of gold onto said germanium to form an Au-Ge alloy,
    removing the composite from said vacuum system and bonding the Au-Ge alloy layer side to a carrier substrate, applying an etchant protective coating to the ends and edges of said composite up to the edge of the germanium substrate,
etching said germanium substrate from the composite,
etching said GaAs layer to tailor said GaAs layer to a desired thickness and smoothness, and
evaporating a Schottky barrier on the layer of GaAs.

12. A method as claimed in claim 11 wherein:
said high temperature vacuum system is heated to a temperature of from about 550°–600° C. to outgas said germanium substrate.

13. A method as claimed in claim 11 wherein:
the concentration of said n-type doped layer is about $10^{17}/cm^3$.

14. A method as claimed in claim 12 wherein:
the concentration of said n-type doped layer is about $10^{17}/cm^3$.

15. A method as claimed in claim 13 wherein:
the temperature during reheating of said vacuum system is from about 500° to about 575° C.

16. A method as claimed in claim 14 wherein:
the temperature during reheating of said vacuum system is from about 500° to about 575° C.

17. A method as claimed in claim 15 wherein:
the concentration of said n+ layer is greater than $10^{18}/cm^3$ and has a thickness of from 0.5–3 μm.

18. A method as claimed in claim 16 wherein:
the concentration of said n+ layer is greater than $10^{18}/cm^3$ and has a thickness of from 0.5–3 μm.

* * * * *